United States Patent
Guo et al.

(10) Patent No.: US 10,074,600 B2
(45) Date of Patent: Sep. 11, 2018

(54) METHOD OF MANUFACTURING INTERPOSER-BASED DAMPING RESISTOR

(75) Inventors: Fei Guo, Richmond Hill (CA); Feng Zhu, Richmond Hill (CA); Julius Din, Reedley, CA (US); Anwar Kashem, Cambridge, MA (US); Sally Yeung, Oakville (CA)

(73) Assignees: ATI Technologies ULC, Markham (CA); Advanced Micro Devices, Inc., Santa Clara, CA (US)

( * ) Notice: Subject to any disclaimer, the term of this patent is extended or adjusted under 35 U.S.C. 154(b) by 783 days.

(21) Appl. No.: 13/436,150

(22) Filed: Mar. 30, 2012

(65) Prior Publication Data
US 2013/0258627 A1 Oct. 3, 2013

(51) Int. Cl.
| H01C 17/00 | (2006.01) |
| H01L 23/498 | (2006.01) |
| H01L 23/14 | (2006.01) |
| H01L 23/50 | (2006.01) |

(52) U.S. Cl.
CPC ...... *H01L 23/49822* (2013.01); *H01L 23/147* (2013.01); *H01L 23/50* (2013.01); *H01L 2224/16* (2013.01); *H01L 2924/15311* (2013.01); *Y10T 29/49082* (2015.01)

(58) Field of Classification Search
CPC .. H01L 2924/3011; H01L 23/64; H05K 1/025
USPC .............. 29/610.1, 825, 829, 841, 846, 852; 257/295, 533, 691, 698, E21.505, 257/E21.525, E27.011
See application file for complete search history.

(56) References Cited

U.S. PATENT DOCUMENTS

| 5,854,534 A | * | 12/1998 | Beilin et al. ................. 257/691 |
| 6,967,138 B2 | * | 11/2005 | Ding ............................ 438/253 |
| 9,064,715 B2 | * | 6/2015 | Lee ...................... H01L 25/0655 |
| 2004/0221199 A1 | | 11/2004 | Erenberger |
| 2005/0094465 A1 | | 5/2005 | Gervasi et al. |
| 2005/0133930 A1 | | 6/2005 | Savastisuk et al. |
| 2006/0087029 A1 | | 4/2006 | Imanaka et al. |
| 2011/0075393 A1 | | 3/2011 | Chandrasekaran et al. |
| 2011/0169164 A1 | | 7/2011 | Nakamura et al. |
| 2012/0175731 A1 | | 7/2012 | Chen et al. |

FOREIGN PATENT DOCUMENTS

WO    WO 2008007258    1/2008

OTHER PUBLICATIONS

Tawfik Arabi et al.; *Dampening High Frequency Noise in High Performance Microprocessor Packaging*; IEEE; SPI 2004; pp. 53-56.
PCT/US2013/034238 International Search Report dated Aug. 21, 2013.

* cited by examiner

*Primary Examiner* — Thiem Phan
(74) *Attorney, Agent, or Firm* — Timothy M. Honeycutt

(57) ABSTRACT

Various resistor circuits and methods of making and using the same are disclosed. In one aspect, a method of manufacturing is provided that includes forming a resistor onboard an interposer. The resistor is adapted to dampen a capacitive network. The capacitive network has at least one capacitor positioned external to the interposer.

14 Claims, 4 Drawing Sheets

METHOD OF MANUFACTURING INTERPOSER-BASED DAMPING RESISTOR

BACKGROUND OF THE INVENTION

1. Field of the Invention

This invention relates generally to semiconductor processing, and more particularly to semiconductor chip devices with interposers and methods of making and using the same.

2. Description of the Related Art

All integrated circuits require electrical power to operate, and packaged integrated circuits, which consist of a semiconductor chip mounted on a package substrate, are no exception. Power is normally delivered to integrated circuits via a power supply and some form of power delivery network. Although currently-available power supplies are designed to supply stable voltages, the actual power delivered to integrated circuits can contain significant amounts of noise. There are many sources of noise, such as voltage fluctuations caused by transient currents due to on-die switching devices, other devices coupled to the power supply, electromagnetic interference and other causes.

Packaged integrated circuits use decoupling capacitors to lower noise on the power supply. Some of these decoupling capacitors are located on the package substrate. Others may be located on-die. In many conventional semiconductor chip package substrates, the resistive losses in the capacitive networks is low enough that resonance becomes a problem.

One conventional technique for addressing the problem of resonance, particularly in package devices, involves fabricating doped polysilicon resistors on-die to provide damping of the capacitive networks. Another technique involves fabricating buried on-die resistors. In either case, the capability to provide sufficient resistive damping may be limited due to die size and complexity. Still another conventional technique requires fabrication of controller equivalent series resistance (ESR) capacitors to be mounted on a package substrate. To make such devices, resistive elements must be added to a capacitor, sometimes at great cost.

The present invention is directed to overcoming or reducing the effects of one or more of the foregoing disadvantages.

SUMMARY OF THE INVENTION

In accordance with one aspect of the present invention, a method of manufacturing is provided that includes forming a resistor onboard an interposer. The resistor is adapted to dampen a capacitive network. The capacitive network has at least one capacitor positioned external to the interposer.

In accordance with another aspect of the present invention, a method of damping a capacitive network that has at least one capacitor is provided. The method includes determining a resistance required to provide a desired level of damping and determining dimensions of the onboard resistor necessary to provide the resistance. The resistor is formed onboard an interposer with the determined dimensions. The onboard resistor is electrically connected to the capacitive network. The at least one capacitor is external to the interposer.

In accordance with another aspect of the present invention, an apparatus is provided that includes an interposer that has an onboard resistor adapted to dampen a capacitive network. The capacitive network has at least one capacitor positioned external to the interposer.

In accordance with another aspect of the present invention, an apparatus is provided that includes a circuit board, a capacitor coupled to the circuit board. The capacitor provides at least part of a capacitive network. An interposer is mounted on the circuit board. The interposer has an onboard resistor adapted to dampen the capacitive network.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various arrangements of interposer-based resistors for providing damping to capacitive circuits, such as those associated with semiconductor chip package decoupling capacitors are disclosed. In one arrangement, an internal conductor trace of known geometry and resistivity is fabricated onboard an interposer and connected between ground and an intermediate power network. Another option utilizes two or more through-silicon-vias in an interposer in a chain linked by a conductor trace of known geometry to supply the resistor. Additional details will now be described.

Figure 1:
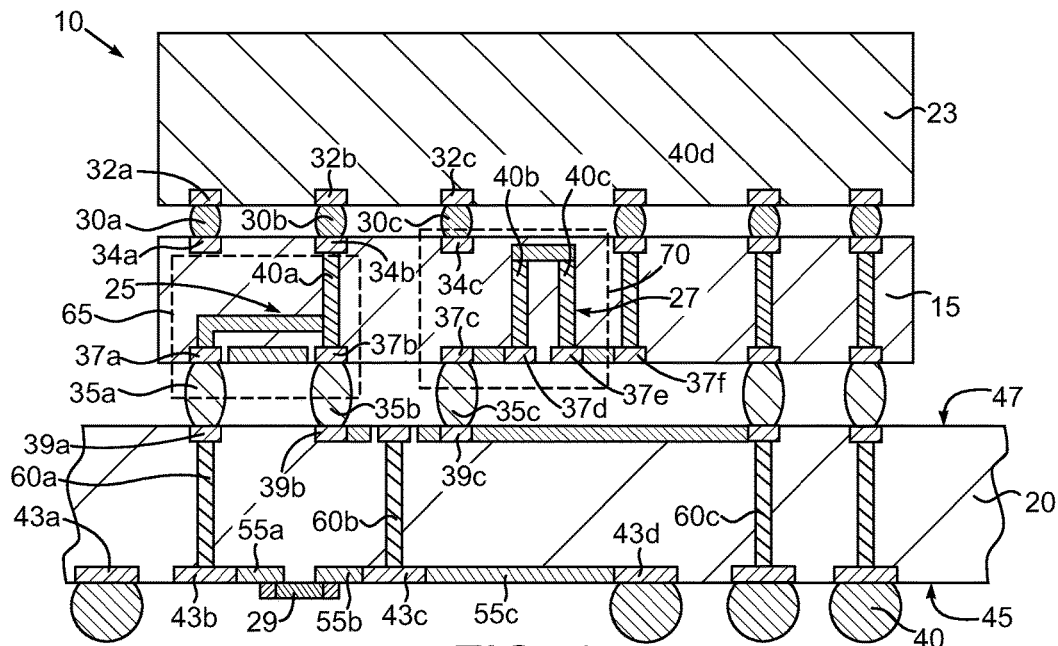
FIG. 1 is a sectional view of an exemplary embodiment of a semiconductor chip device that includes an interposer mounted on a circuit board.
Figure 2:
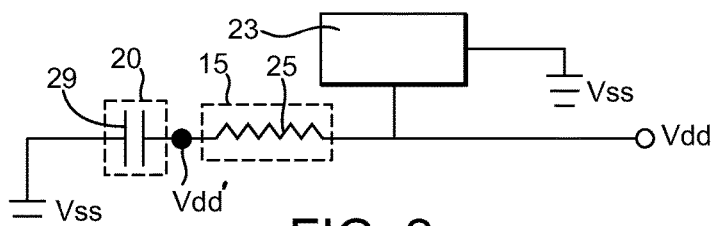
FIG. 2 is a schematic depiction of an exemplary damping resistor circuit for a circuit board capacitive network.

In the drawings described below, reference numerals are generally repeated where identical elements appear in more than one figure. Turning now to the drawings, and in particular to FIG. 1, therein is shown a sectional view of an exemplary embodiment of a semiconductor chip device 10 that includes an interposer 15 mounted on a circuit board 20. A semiconductor chip 23 may be mounted on the interposer 15, and the interposer 15 used to establish electrical conductivity between the semiconductor chip 23 and the circuit board 20. The interposer 15 may be provided with one or more onboard resistors, two of which are visible and labeled 25 and 27, which are designed to provide damping resistance for a capacitive network that includes one or more capacitors coupled to the circuit board 20, one of which is visible and labeled 29. Additional details of the resistors 25 and 27 will be provided below. A schematic representation of the capacitive circuit involving the interposer 15, the semiconductor chip 23, the resistor 25 and the capacitor 29 is shown in FIG. 2. FIG. 2 will be discussed in more detail below.

None of the embodiments disclosed herein is reliant on a particular functionality of the semiconductor chip 23, the interposer 15 or the circuit board 20. Thus, the semiconductor chip 23 may be any of a variety of different types of circuit devices used in electronics, such as, for example, interposers, microprocessors, graphics processors, combined microprocessor/graphics processors, application specific integrated circuits, memory devices or the like, and may be single or multi-core. The semiconductor chip 23 may be constructed of bulk semiconductor, such as silicon or germanium, or semiconductor on insulator materials, such as silicon-on-insulator materials or even insulator materials. Thus, the term "semiconductor chip" also contemplates insulating materials. Here, the semiconductor chip device 10 includes the semiconductor chip 23, but additional semiconductor chips may be stacked thereon.

Like the semiconductor chip 23, the interposer 15 may be constructed of bulk semiconductor, such as silicon or germanium, or semiconductor on insulator materials, such as silicon-on-insulator materials or even insulator materials. Materials with coefficients of thermal expansion similar or equal to that of the semiconductor chip 23 may impart lower thermally-induced mechanical stresses. To alleviate some issues associated with differing coefficients of thermal expansion among the components of the semiconductor chip device 10, underfill (not shown) may be placed between the semiconductor chip 23 and the interposer 15 and between the interposer 15 and the circuit board 20.

The circuit board 20 may be another semiconductor chip of the type described above, a semiconductor chip package substrate, a circuit card, or virtually any other type of printed circuit board. Monolithic structures, such as those made of ceramics or polymers could be used. Alternatively, well-known build-up designs may be used. In this regard, the circuit board 20 may consist of a central core upon which one or more build-up layers are formed and below which an additional one or more build-up layers are formed. The core itself may consist of a stack of one or more layers. So-called "coreless" designs may be used as well. The layers of the circuit board 20 may consist of an insulating material, such as various well-known epoxies or other resins interspersed with metal interconnects. A multi-layer configuration other than buildup could be used.

Still referring to FIG. 1, the semiconductor chip 23 may be electrically connected to the interposer 15 by way of plural interconnects, three of which are labeled 30a, 30b and 30c. The interconnects 30a, 30b and 30c may be solder bumps, micro bumps, conductive pillars with or without solder caps or cladding or other types of interconnects. Exemplary materials include copper, aluminum, gold, platinum, palladium, silver, combinations of these or other materials. The semiconductor chip 23 may be provided with plural conductor pads 32a, 32b and 32c to connect to the interconnects 30a, 30b and 30c. The interposer 15 may be similarly provided with plural conductor pads 34a, 34b and 34c to connect to the interconnects 30a, 30b and 30c. The conductor pads 32a, 32b and 32c and 34a, 34b and 34c may be part of the outermost metallization layers of the semiconductor chip 23 and the interposer 15, respectively. There may be many layers of metallization and active circuits in the semicondutor chip 23 and the interposer 15, respectively, that are not shown for simplicity of illustration. The conductor pads 32a, 32b and 32c and 34a, 34b and 34c may be composed of copper, aluminum, gold, platinum, palladium, silver, titanium, nickel, vanadium, combinations of these or others. In an exemplary embodiment, the conductor pads 32a, 32b and 32c and 34a, 34b and 34c may be constructed of a laminate of titanium, copper and nickel-vanadium.

The interposer 15 may be electrically connected to the circuit board 20 by way of plural interconnects, three of which are labeled 35a, 35b and 35c. The interconnects 35a, 35b and 35c may be solder bumps, micro bumps, conductive pillars with or without solder caps or cladding or other types of interconnects. Exemplary materials include copper, aluminum, gold, platinum, palladium, silver, combinations of these or other materials. The interposer 15 may be provided with plural conductor pads 37a, 37b and 37c to connect to the interconnects 35a, 35b and 35c, and additional conductor pads 37d, 37e and 37f to make up part of the circuit of the resistor 27. The circuit board 20 may be similarly provided with plural conductor pads 39a, 39b and 39c to connect to the interconnects 35a, 35b and 35c. The conductor pads 37a, 37b and 37c, 37d, 37e and 37f and 39a, 39b and 39c may be part of the outermost metallization layers of the interposer 15 and the circuit board 20, respectively. The conductor pads 37a, 37b and 37c, 37d, 37e and 37f and 39a, 39b and 39c may be composed of copper, aluminum, gold, platinum, palladium, silver, titanium, nickel, vanadium, combinations of these or others. In an exemplary embodiment, the conductor pads 37a, 37b and 37c, 37d, 37e and 37f and 39a, 39b and 39c may be constructed of a laminate of titanium, copper and nickel-vanadium.

To provide electrical pathways through the interposer 15, multiple through-silicon-vias (TSV), a few of which are labeled 40a, 40b, 40c and 40d, may be constructed. Since the interposer 15 may be constructed of other than silicon, the term "TSV" is intended to include materials in addition to silicon. The TSVs 40a, 40b, 40c and 40d may be composed of a variety of conducting materials, such as copper, aluminum, gold, silver, platinum, palladium, combinations of these or the like. Well-known techniques for fabricating TSV's may be used, such as trench etching by chemical or laser techniques, liner insulating layer formation and metal deposition by plating, chemical vapor deposition, physical vapor deposition or other techniques. It should be understood that the conductor pads 37a, 37b and 37c, 37d, 37e and 37f and 39a, 39b and 39c may include underbump metallization and be connected to the TSVs 40a, 40b, 40c and 40d by way of redistribution layer structures, which are not shown for simplicity of illustration.

The circuit board 20 may be electrically connected to some other electronic device (not shown) by plural interconnects collectively labeled 40. The interconnects 40 may be the depicted ball grid array 40. Optionally, other types of interconnect structures such as pin grid arrays, land grid arrays or others may be used. The circuit board 20 may be provided with plural conductor pads 43a, 43b, 43c and 43d to connect to corresponding of the interconnects 40. The conductor pads 43a, 43b, 43c and 43d may be composed of copper, aluminum, gold, platinum, palladium, silver, titanium, nickel, vanadium, combinations of these or others. In an exemplary embodiment, the conductor pads 43a, 43b, 43c and 43d may be constructed of a laminate of titanium, copper and nickel-vanadium.

A lower side 45 of the circuit board 20 may be populated with one or more capacitors, such as the depicted capacitor 29. The capacitor 29 may be used to provide decoupling capacitance, and include multiple plates and terminals as desired. However a capacitive network may be provided by placing the capacitor(s) 29 on the upper side 47 of the circuit or both sides 45 and 47.

The circuit board 20 may include large numbers of internal electrically conductive pathways. A few of these are represented schematically by the conductor lines 50a, 50b and 50c. It should be understood that the lines 50a, 50b and 50c may consist of multiple layers of metallization connected vertically by vias or other structures.

The resistor 25 is electrically connected to the capacitive network, including the capacitor 29, to provide damping. The resistor 27 may be connected to the capacitor 29 or some other capacitor (not shown) of the circuit board 20. The damped capacitive circuit using the resistor 25 and the capacitor as examples is illustrated schematically in FIG. 2. There may be three networks: (1) a Vdd power supply to the semiconductor chip 23; (2) a Vss ground return; and (3) a Vdd' intermediate power network. The Vdd' network is provided to establish a dedicated path from the capacitor 29 on the circuit board 20 to the resistor 25 in the interposer 15. Instead of putting the capacitor 29 across Vdd and Vss (as is customary in a conventional system), one side of the capacitor 29 is connected to Vdd' and the other to Vss. Referring again to FIG. 1, an exemplary physical implementation of the capacitor connection to Vdd' is the conductor trace 55a, the conductor pad 43b, the conductor pathway 60a, the pad 39a, the interconnect 35a and the pad 37a. An exemplary physical implementation of the capacitor connection to Vss is the conductor trace 55b, the conductor pad 43c, the conductor trace 55c and the conductor pad 43d. The exact routing for the capacitor-to-Vdd' and capacitor-to-Vss connections may take on a myriad of possibilities.

Attention is again turned briefly to FIG. 1. The resistors 25 and 27 are implemented onboard the interposer 15 in two of what may be many possible physical variations. The portions or FIG. 1 circumscribed by the dashed rectangles 65 and 70 will be shown at greater magnification in FIG. 3 in order to illustrate additional features of this illustrative embodiment of the resistors 25 and 27. Attention is now turned to FIG. 3. The resistor 25 may consist of a conductor trace 75 that is tied to the conductor pad 37a and the TSV 40a. The conductor trace 75 is fabricated with a known length $x_1$, thickness $z_1$ and a width along the y-axis that will be represented more clearly in FIG. 4 to be discussed below. The TSV 40a is similarly fabricated with a known lateral dimension $x_2$ and a known height or thickness $z_2$ as measured from the conductor pad 37b. By specifying the dimensions $z_1$, $x_1$, $z_2$, $x_2$ and the y-axis dimension of the conductor trace 75 and the TSV 40a, the resistance of the combination of those two structures may be computed and known in advance for providing the desired level of damping resistance for the capacitor 29 shown in FIG. 1. The trace 75 may be connected to the conductor pad 37a by way of an extension 80, which may be a conductive via or other structure, and if large enough, included in the calculations for the resistance of the resistor 25. To reduce inductance effects, a conductor trace 85 connected to Vss may be fabricated in the interposer 15 to overlap with the trace 75. The conductor trace 85 may be fabricated from the same materials as the conductor pads 37a and 37b.

The resistor 27 has a different possible construction. Here, the resistor 27 may be fabricated entirely internally to the interposer 15 by utilizing the TSVs 40b and 40c in a chain connected by a conductor trace 90. Here, the TSV 40b is connected to the conductor pad 37d and the TSV 40c is connected to the conductor pad 37e. The TSVs 40b and 40c may each be fabricated with some lateral dimension $x_2$ and a vertical dimension $z_3$ measured from the pads 37d and 37e. The trace 90 may be fabricated with some length $x_3$, some thickness $z_4$ and an y-axis dimension that will be better illustrated in FIG. 4 to be discussed below. With these preselected dimensions $x_2$, $x_3$, $z_3$ in hand, the areas and thus the resistances of the TSVs 40b and 40c and the trace 90 may be determined and used as a basis for providing a known damping resistance to one or more capacitors of the circuit board 20. In either case, the placement of the resistor 27 and the resistor 25 onboard the interposer 15 will not consume area of the semiconductor chip 23.

The traces 75 and 90 may be composed of a variety of conductor materials, such as copper, aluminum, gold, platinum, palladium, silver, titanium, nickel, vanadium, combinations of these or others, and like the other conductors disclosed herein, fabricated by well-known plating, chemical vapor deposition, physical vapor deposition or other techniques. In an exemplary embodiment, the traces 75 and 90 may be constructed of copper. Patterning may be by masking and chemical etching, via additive or other processes.

Figure 3:
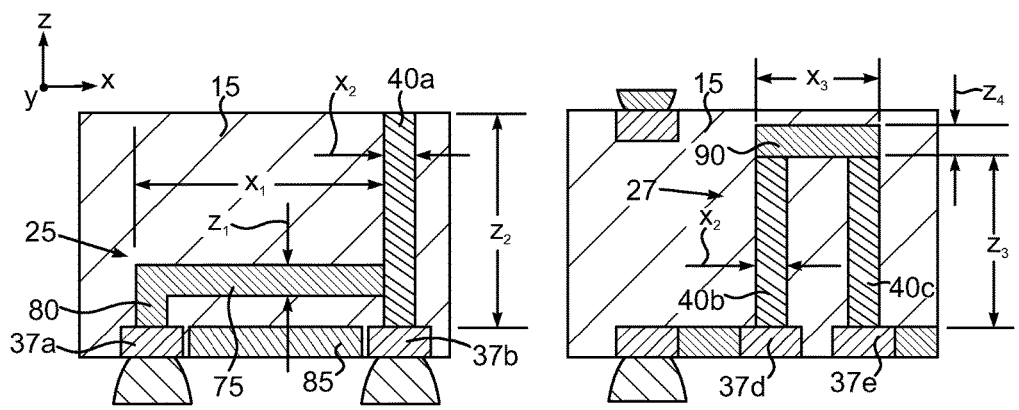
FIG. 3 is a portion of FIG. 1 shown at greater magnification.
Figure 4:
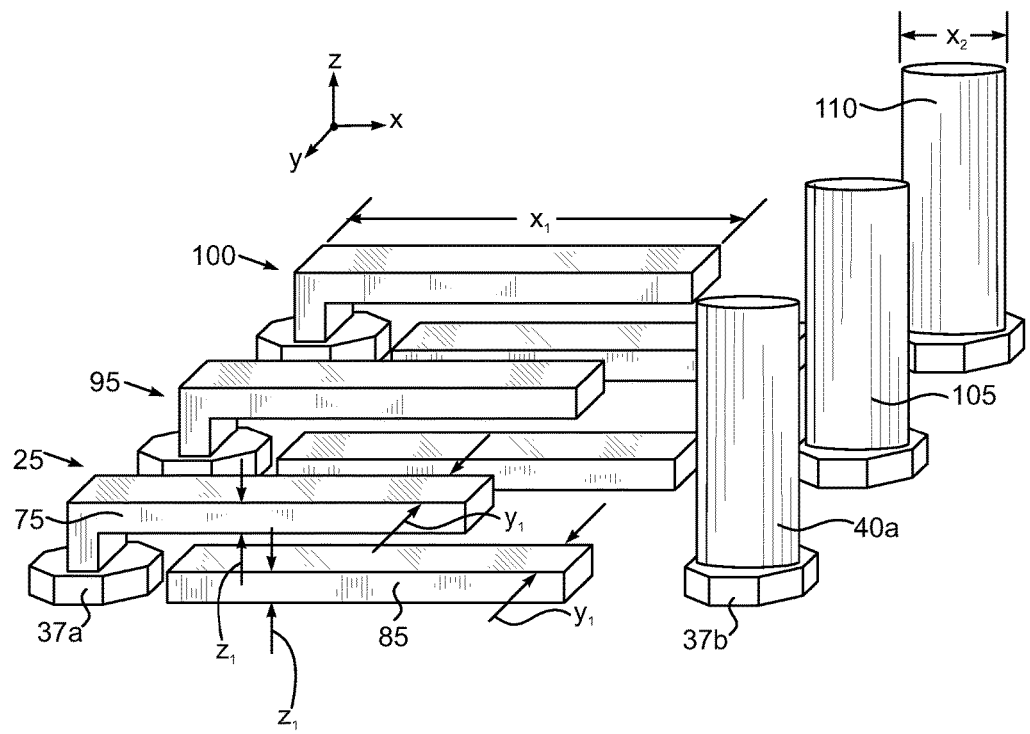
FIG. 4 is a pictorial view of a few exemplary interposer-based resistors shown removed from an interposer and partially exploded from respective through-silicon-vias.

Still further details of the resistor 25 may be understood by referring now also to FIG. 4, which is a pictorial view of the resistor 25 along with a portion of the TSV 40a slightly exploded therefrom along the x-axis. The interposer 15 depicted in FIGS. 1 and 3 is not shown for simplicity of illustration. Note that the conductor pads 37a and 37b and the traces 75 and 85 are visible. The conductor pads 37a and 37b may have the octagonal footprint as shown or virtually any other shape as desired. As noted above, the conductor trace 75 may have some thickness $z_1$, some length $x_1$ and a width or y-axis dimension $y_1$. The grounded conductor trace 85 may be similarly provided with the thickness $z_1$, the length $x_1$ and the width $y_1$ or many other dimensions and serve as a grounded overlap conductor to reduce the inductance from the Vdd to the Vdd' networks (see FIG. 2). The TSV 40a has some lateral dimension $x_2$, which may be a diameter in the event the TSV 40a is cylindrical, or some other lateral dimension for a different shaped TSV 40a. Additional resistors 95 and 100 capable of providing damping may be fabricated in parallel or even in series with the resistor 25. Indeed, it should be understood that the interposer 15 depicted in FIGS. 1 and 2 may be implemented with a large number of such resistors 25, 95 and 100. Note that the resistors 95 and 100 may be constructed like the resistor 25. Like the TSV 40a, the TSVs 105 and 110 associated with the resistors 95 and 100 may also be provided with some lateral dimension $x_2$.

An exemplary calculation of resistance for a given resistor will now be described in conjunction with FIGS. 3 and 4 and using the resistor 25 and the trace 75 for the example. The resistance $R_{25}$ of the resistor 25 is given by:

$$R_{25} = R_{75} \tag{1}$$

where the resistance $R_{75}$ of the trace 75 is given by:

$$R_{75} = \frac{r_{75} x_1}{y_1 z_1} \tag{2}$$

where $r_{75}$ is the resistivity of the material of the trace 75. Using copper as an example, $r_{75}$ is $5.8E7\Omega^{-1}$. The resistance $R_{40a}$ of the TSV 40a is given by:

where $r_{40a}$ is the resistivity of the material of the TSV 40a, which is the same as $r_{75}$ for copper as the exemplary material. If greater accuracy is desired, the resistance(s) of other components in series with the trace 75 and the TSV 40a, such as the conductor pads 37a, may be tacked onto Equation (1) using variations of Equation (2) tailored to the geometry and material specification of that additional component(s).

The resistance $R_{27}$ of the resistor 27 given by:

$$R_{27} = R_{90} + 2R_{40b} \qquad (3)$$

where the resistance $R_{90}$ of the trace 90 is given by:

$$R_{90} = \frac{r_{90} x_3}{y_1 z_4} \qquad (4)$$

where $r_{90}$ is the resistivity of the material of the trace 90, and assuming that the same width $y_1$ is used for the trace 90 and the same lateral dimension $x_2$ is used for the TSVs 40b and 40c (though this is not necessary) and where:

$$R_{40b} = R_{40c} = \frac{4 r_{40b} z_4}{\pi x_2^2} \qquad (5)$$

Figure 5:
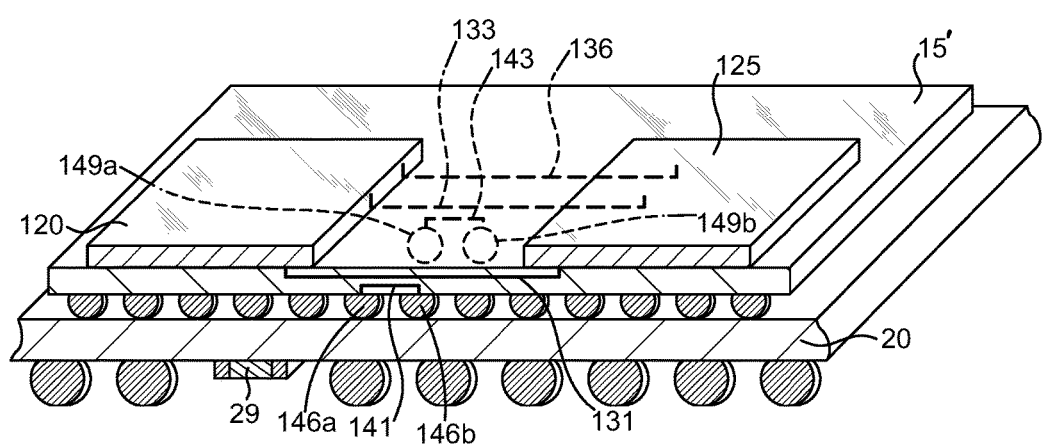
FIG. 5 is a hybrid sectional view and pictorial view of an alternate exemplary embodiment of a semiconductor chip device with two semicondutor chips mounted on an interposer.

The usage of an interposer-based resistor may be extended to situations involving multiple semiconductor chips positioned on an interposer but not necessarily in a stacked arrangement. For example, FIG. 5 illustrates a combined sectional and pictorial view of an exemplary interposer 15' mounted on the circuit board and upon which a semiconductor chip 120 and another semiconductor chip 125 may be mounted in spaced-apart relation. The semiconductor chips 120 and 125 may be configured like the semiconductor chip 23 described above. The circuit board 20 is shown in section along with the exemplary capacitor 29. Multiple electrical connections may be provided between the semiconductor chips 120 and 125. Three of these are illustrated and include the conductive pathway 131, which is visible in section and two others 133 and 136, which are inside the interposer 15' and thus shown in dashed. There may be hundreds of such conductive pathways 131, 133 and 136. Two exemplary resistors 141 and 143 capable of providing damping are illustrated schematically. The resistor 141 is visible in section but the resistor 143 is not in section and internal to the interposer 15', and thus shown in dashed. The resistor 141 may be electrically connected to one or more of the bumps and in this case the bumps 146a and 146b. The resistor 143 may be similarly connected to bumps 149a and 149b. The resistors 141 and 143 may number more than two and may be configured like any of the embodiments disclosed herein, such as, for example, the resistors 25 and 27 described above. Because the resistors 141 and 143 may be fabricated in the channel 151 between the semiconductor chips 120 and 125, no additional interposer area is required and no power bumps need removal, which might otherwise impact power delivery. Of course, it should be noted that additional semiconductor chips (not shown) could be stacked on one or both of the semiconductor chips 120 and 125.

Figure 6:
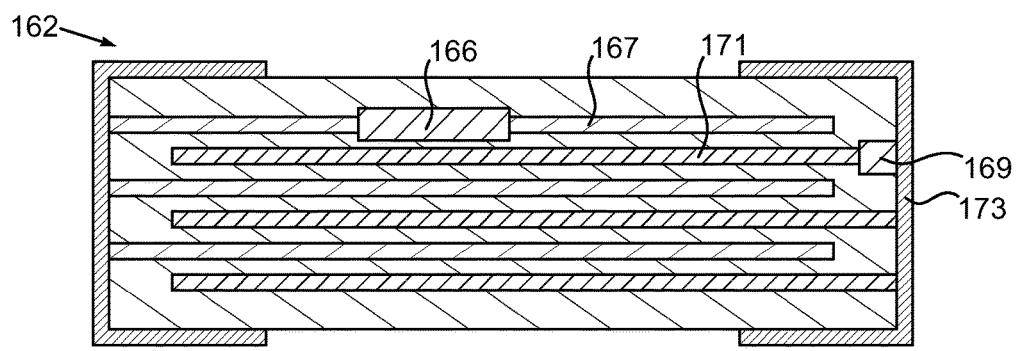
FIG. 6 is a sectional view of a conventional controller equivalent series resistance capacitor.

As noted in the Background section above, a conventional method of providing damping resistance to a decoupling capacitor involves the usage of a controlled ESR capacitor. An example of such is shown in section in FIG. 6. Here, two different ways of providing controlled ESR for a conventional capacitor 162 are illustrated. One method involves placing a more resistive material 166 in one or more of the capacitor plates 167. Another possible arrangement involves the placement of another resistive material 169 between a capacitor plate 171 and one of the capacitor electrodes 173. In either case, the fabrication of such a controlled ESR capacitor can be costly.

Figure 7:
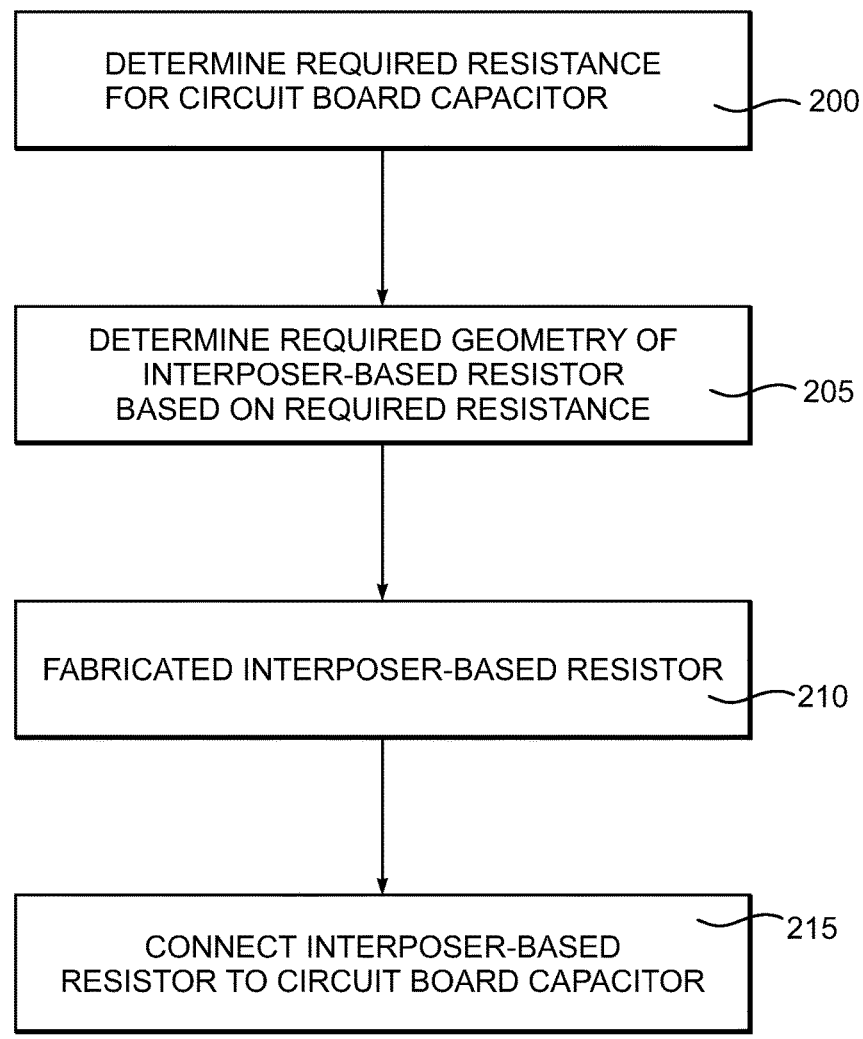
FIG. 7 is a flow chart depicting steps of an exemplary method of providing interposer-based resistor damping.

An exemplary method of providing a damping resistance for a circuit board capacitor may be understood by referring now to the flow chart of FIG. 7. At step 200, the required resistance for a given circuit board capacitor is determined. At step 205, the required geometry of an interposer-based resistor is determined based on the required resistance for the circuit board capacitor. This will entail determining the required x, y and z or other dimensions for the resistor components based on prevailing design rules and geometries and material considerations. At step 210, the interposer-based resistor is fabricated onboard the interposer. At step 215, the interposer based-resistor is connected to the circuit board capacitor by, for example, the electrical pathways depicted in FIGS. 1 and 2.

It should be understood that the semiconductor chip 23 depicted in FIG. 1 and the semiconductor chips 120 and 125 depicted in FIG. 5 may be used to perform electronic functions. The types of electronic functions are virtually limitless and include operations such as floating point calculations, memory management, input output functions, analog processing and power management to name just a few.

Figure 8:
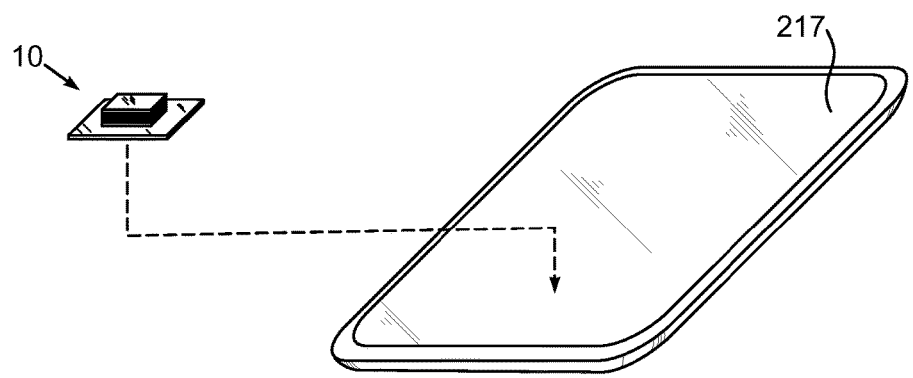
FIG. 8 is a pictorial view depicting an exemplary semiconductor chip device exploded from an exemplary electronic device.

Any of the disclosed embodiments of the semiconductor chip device may be incorporated into another electronic device such as the electronic device 217 depicted in FIG. 8. Here, the semiconductor chip device 10 is shown exploded from the electronic device 217. The electronic device 217 may be a computer, a server, a hand held device, or virtually any other electronic component.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    forming a resistor onboard an interposer, the interposer adapted to have a first semiconductor chip mounted thereon, the resistor adapted to dampen a capacitive network, the capacitive network having at least one capacitor positioned off the interposer and the first semiconductor chip.

2. The method of claim 1, comprising coupling a circuit board to the interposer and the at least one capacitor to the circuit board.

3. The method of claim 1, wherein the forming a resistor comprises fabricating a conductor line and a first through-silicon-via coupled to the conductor line.

4. The method of claim 3, wherein the forming the resistor comprises fabricating a second through-silicon-via coupled to the conductor line, the first and second through-silicon-vias and the conductor line being connected in series.

5. The method of claim 1, comprising coupling the first semiconductor chip to the interposer.

6. The method of claim 5, comprising coupling a second semiconductor chip to the interposer.

7. The method of claim 1, comprising coupling the onboard resistor between a power network and a ground.

8. A method of manufacturing, comprising:
forming a resistor onboard an interposer, the interposer adapted to have a first semiconductor chip mounted thereon, the resistor having a resistance selected to provide a desired level of damping for a capacitive network, the capacitive network having at least one capacitor positioned off the interposer and the first semiconductor chip.

9. The method of claim 8, comprising coupling a circuit board to the interposer and the at least one capacitor to the circuit board.

10. The method of claim 8, wherein the forming a resistor comprises fabricating a conductor line and a first through-silicon-via coupled to the conductor line.

11. The method of claim 8, comprising coupling the first semiconductor chip to the interposer.

12. The method of claim 11, comprising coupling a second semiconductor chip to the interposer.

13. The method of claim 12, wherein the second semiconductor chip is stacked on the first semiconductor chip.

14. The method of claim 12, wherein the second semiconductor chip is positioned lateral to the first semiconductor chip.

* * * * *